United States Patent
Gan et al.

(10) Patent No.: US 6,225,149 B1
(45) Date of Patent: May 1, 2001

(54) METHODS TO FABRICATE THIN FILM TRANSISTORS AND CIRCUITS

(76) Inventors: Feng Yuan Gan, 2100 St. Marc, Apt. 1203, Montreal, Quebec (CA), H3H 2G6; Ishiang Shih, 3300 Bahama Street, Brossard, Quebec (CA), J4Z 2R4

( * ) Notice: Subject to any disclaimer, the term of this patent is extended or adjusted under 35 U.S.C. 154(b) by 0 days.

(21) Appl. No.: 09/303,743

(22) Filed: May 3, 1999

(51) Int. Cl.[7] .............................. H01L 21/00; H01L 21/84
(52) U.S. Cl. ...................... 438/151; 438/492; 438/497; 438/500
(58) Field of Search ................................. 438/151, 492, 438/497, 500

(56) References Cited

U.S. PATENT DOCUMENTS

| | | | |
|---|---|---|---|
| 5,334,864 | * | 8/1994 | Tokunaga et al. ................ 257/78 |
| 6,049,099 | * | 4/2000 | Vaccaro et al. .................. 257/200 |

OTHER PUBLICATIONS

Chu et al., Solution–Grown Cadmium Sulfide Films for Photovoltaic Devices, J. Electrochem. Soc., 139 (1992) 2443.*

Ozsan et al., Optical and Electrical Characterization of Chemically Deposited Cadmium Sulfide Thin Films, Conference Record of the Twenty Fourth IEEE Photovoltaic Specialists Conference, 1 (1994) 327.*

* cited by examiner

Primary Examiner—Richard Elms
Assistant Examiner—Christian D. Wilson

(57) ABSTRACT

A method for fabricating a thin film field effect transistor is described in this invention. The active layer of the thin film transistor (TFT) is formed by a low cost chemical bath deposition method. The fabrication procedure includes deposition of a metal layer on an insulating substrate, patterning of the metal layer to form a metal gate, formation of the di-electric layer, deposition of the active layer and formation of source and drain contacts.

8 Claims, 3 Drawing Sheets

METHODS TO FABRICATE THIN FILM TRANSISTORS AND CIRCUITS

[1] FIELD OF INVENTION

Figure 1A:
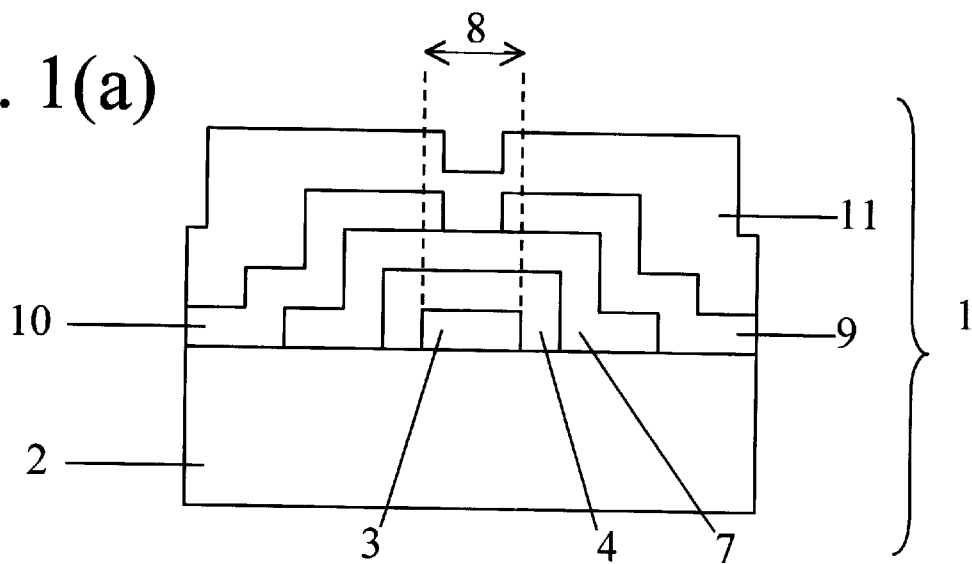

This invention relates to a thin film transistor, a circuit of thin film transistors and a low cost method of making the same.

[2] BACKGROUND OF THE INVENTION

In flat panel electronic displays, light switching elements are arranged in a two dimensional array where the optical state of each element (or pixel) is controlled by at least one transistor. In addition to the transistors used to control the optical state of pixels, transistors are required to form column driving circuit and row driving circuit which control the flow of electrical signals to individual pixels. Since most of the flat panel electronic displays are fabricated on low cost glass substrates, the transistors used to control the optical state and the transistors to form the row and column driving circuits are usually in a thin film form. The active region of conventional thin film transistor is a layer of semiconductor. There are several requirements for a thin film transistor used in high quality electronic display. Firstly the leakage current between drain and source in the Off-state must be small (<10 pA). Secondly, the On-state current at a given voltage (10 volts) must be large (>1 $\mu$A). Finally, the threshold voltage must be small and the mobility of charge carriers in the channel must be large.

Conventional TFTs are formed from a thin film of amorphous Si (a-Si). More recently, some TFTs have been fabricated using polycrystalline Si (poly-Si). Thin films of a-Si for transistors are typically deposited by CVD method at substrate temperatures of about 350° C. For deposition of poly-Si films, a LPCVD method is used at substrate temperatures ranging from 500 to 650° C. Hence the power consumption for the deposition of Si films is high. Furthermore, the deposition of uniform Si films on substrates with relatively large dimensions required for the electronic displays is difficult to achieve due to the distribution of molecules in the reaction chamber. Although the mobility of charge carriers in poly-Si is large and in the order of 200 cm$^2$/V-sec, the mobility in a-Si is quite small, in the order of 5–10 cm$^2$/V-sec. The above mobility values are for Si films prior to the formation of field effect transistors. When a thin film field effect transistor is fabricated with a-Si, the effective mobility of charge carriers is reduced to 0.3–1 cm$^2$/V-sec, whereas the effective mobility of carriers in poly-Si is reduced to 25–100 cm$^2$/V-sec. The precise values of effective mobility in a-Si and in poly-Si TFTs are determined by the deposition temperature of the a-Si and poly-Si films.

Thin film transistors may be fabricated using CdS or CdSe as an active semiconductor layer. As shown in Table 1, both the Hall mobility, $\mu_H$, and the effective mobility, $\mu_{eff}$, are greater than that of a-Si. Therefore, these two materials are potentially good candidates for forming active layer of thin film transistors. It is also noted that most of thin films of CdS and CdSe reported in literatures are n-type in conduction. Thin film transistors based on CdSe have been fabricated for high brightness LCD panels [see T.P. Brody, IEEE Trans. ED-20, p.995–1001, 1973]. In such a prior art CdSe thin film transistor, thin film of CdSe required for the active layer was deposited by a vacuum thermal evaporation method. Although some success has been demonstrated in the prior art, it has been observed that the reproducibility and uniformity of surface electronic properties of the vacuum deposited large area CdSe films are difficult to control. Because of the difficulty in reproducibility of the surface electronic properties of vacuum deposited CdSe, variation of the threshold voltage of the thin film transistors from one substrate to others is too large to achieve high production yield.

TABLE 1

| Semiconductors | Energy Gap (eV) | $\mu_H$ (cm$^2$/V-s) | $\mu_{eff}$ (cm$^2$/V-s) |
|---|---|---|---|
| CdS | 2.4 | 250 | 100~150 |
| CdSe | 1.7 | 580 | 20~480 |
| a-Si | 1.9 | 5~20 | 0.3~1 |
| p-Si | 1.12 | ~200 | 25~100 |
| s-Si | 1.12 | 1880 | 160~ |

Therefore, it would be desirable to develop a method to fabricate thin film transistors where the active semiconductor layer is deposited at low temperatures using a low cost method. The mobility of charge carriers in the deposited films should be as large as possible, preferably greater than 10 cm$^2$/V-sec. Furthermore, this method should ideally be capable of depositing semiconductor films on large area substrates without the need of expensive equipment.

[3] SUMMARY OF THE INVENTION

This invention relates to a thin film transistor, a circuit of thin film transistors and a low cost method of making the same. The active layer of the thin film transistors is deposited by a low cost chemical bath deposition method (CBD). One object of the present invention is to provide a process to fabricate thin film transistors with a low thermal budget. The other object is to produce a thin film transistor where mobility of charge carriers in the active semiconductor layer is high. Yet another object is to provide a treatment method of thin film transistors to increase further the mobility of charge carriers in the active channel.

[4] BRIEF DESCRIPTION OF THE DRAWINGS

FIG. 1(a) A schematic cross-sectional view of the fabricated TFT with anodized gate insulator. (b) A schematic cross-sectional view of another TFT with CVD deposited gate insulator. (c) A schematic top view of the fabricated TFT shown in (a).

Figure 2:
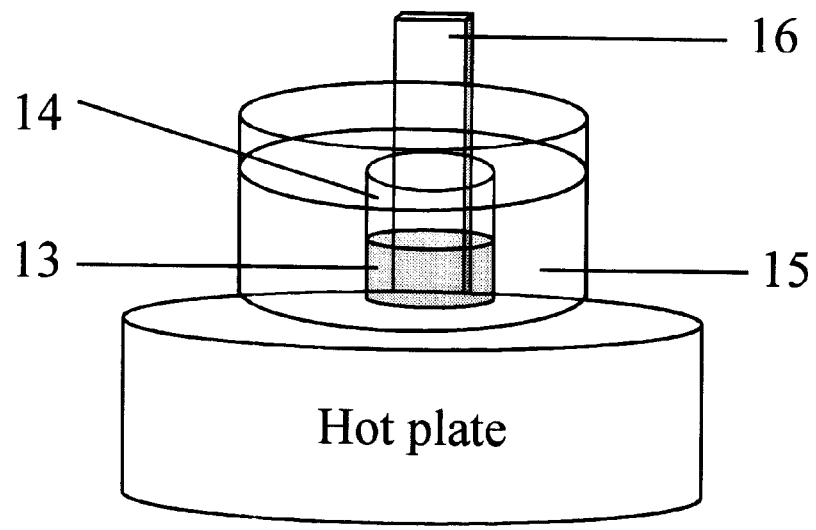

FIG. 2 Experimental setup used for the chemical bath deposition of CdS or CdSe thin films for thin film transistors and circuits.

Figure 3:
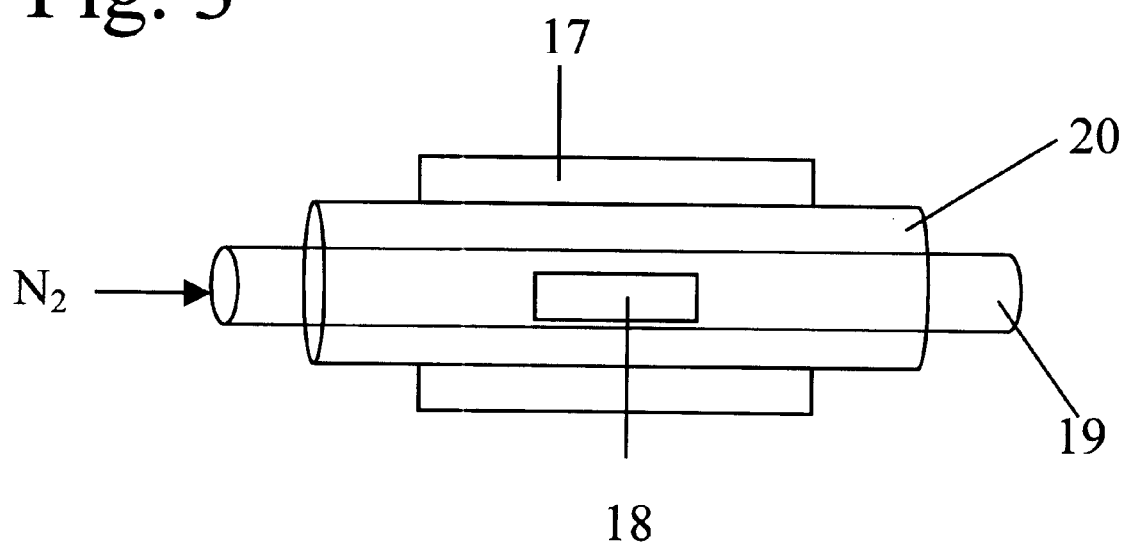

FIG. 3 Experimental setup used for the heat treatment of chemical bath deposited CdS or CdSe thin films and circuits.

Figure 4:
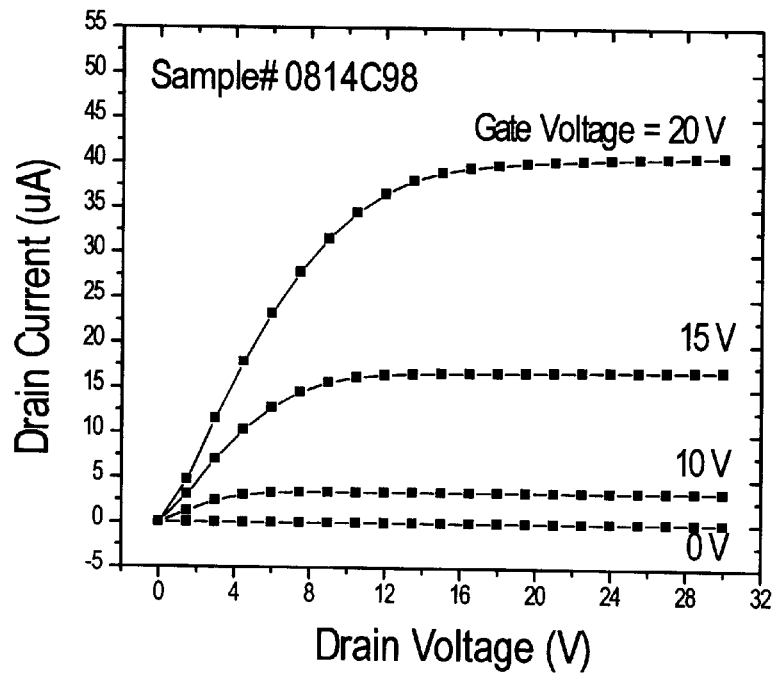

FIG. 4 Drain current-drain voltage characteristics of a CdS-TFT with a channel length of 40 $\mu$m and width of 200 $\mu$m.

Figure 5:
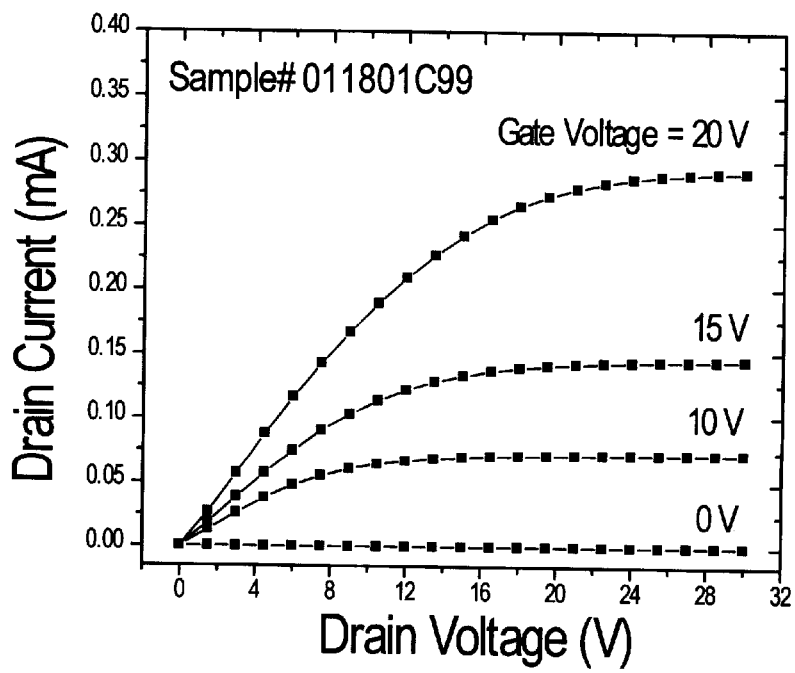

FIG. 5 Drain current-drain voltage characteristics of a CdSe-TFT with a channel length of 40 $\mu$m and width of 200 $\mu$m.

[5] DETAILED DESCRIPTION OF THE PREFERRED EMBODIMENTS

Fabrication Processes for TFTs with CBD Deposited CdS films

Figure 1B:
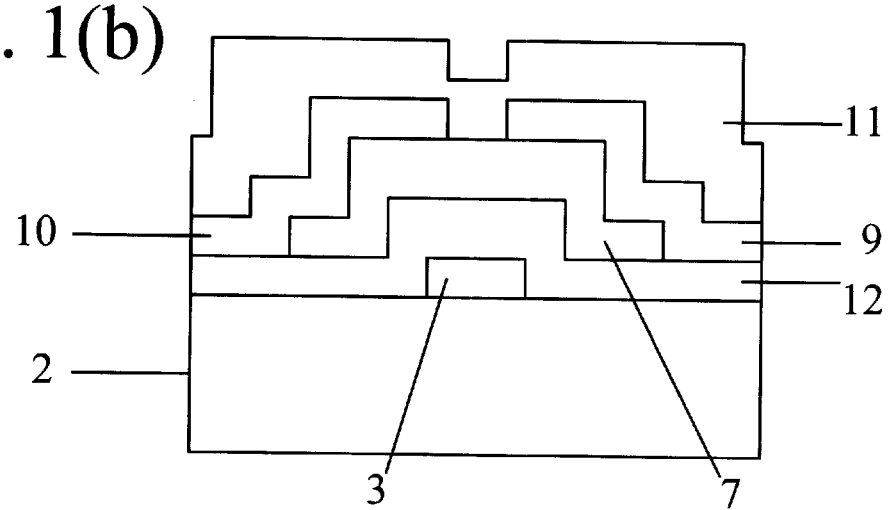
Figure 1C:
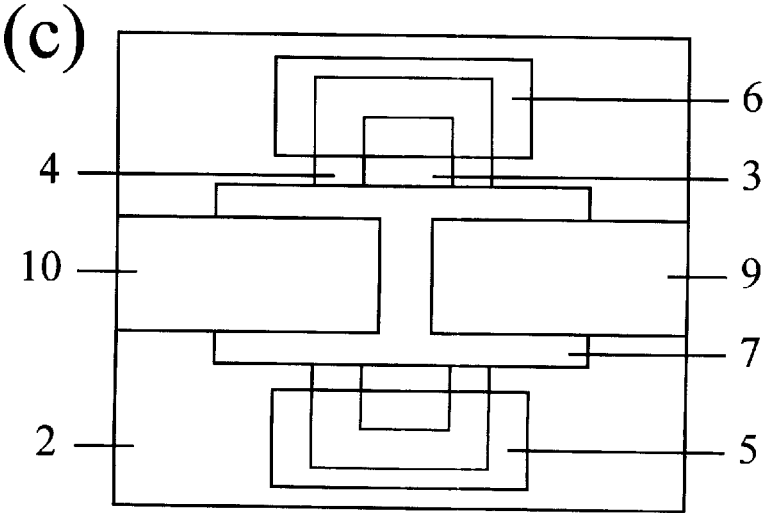

Referring to FIG. 1(a), where there is shown a TFT (1) embodiment. A glass plate (2) with a thickness of 1 mm is used as the substrate. A layer of metal (3) such as Al or Ta is deposited by standard vacuum deposition method and then patterned to form gate. A layer of dielectric layer (4) is deposited. This dielectric layer may be in a form of $Ta_2O_5$, $TaO_x$ or $Al_2O_3$ which is deposited by an anodization method. Alternately, it may be $SiO_2$, $SiN_x$, $Si_3N_4$, $TiO_2$, $Ta_2O_5$, $TaO^x$ or $Al_2O_3$ and deposited by a CVD method. The thickness of the dielectric layer should be large enough, more than 30 nm, so that leakage current through this dielectric layer is minimized but is not too large, less than 500 nm, to give rise to an excessive threshold voltage of the thin film transistor. Due to the nature of the anodization process, only the surfaces of the metal layer (3) are covered by the dielectric layer. After the deposition of the thin dielectric layer, windows (5,6) as shown in FIG. 1(c) are cut through the dielectric layer by photolithography and etching method for electrical contacts. A layer of semiconductor (7) is now deposited over the entire sample surface by a chemical bath deposition method and then selectively etched by a photolithography and etching method to create active channel region (8) of the thin film transistor. Metal contacts for drain (9) and source (10) are deposited by a vacuum deposition and selective etching method. As a final step, a layer of SiNe or polyimide (11) may be applied over the entire surface as protective layer. When the dielectric layer is deposited by the CVD method, as shown in FIG. 1(b), the dielectric layer (12) covers the entire substrate. A top view of the TFT in FIG. 1(a) is shown in FIG. 1(c). It is understood that these figures are presented for description purposes only. Dimensions and relative position of each region may vary with the design. In addition, a large number of TFTs may be incorporated into a single substrate for circuit applications. These TFTs will be fabricated in the same fabrication run using the chemical bath deposition method for the active layer.

In one embodiment according to this invention, the semiconductor layer (7) in FIG. 1(a) for the thin film transistors is a CdS which is deposited by a chemical bath deposition process, using set-up shown in FIG. 2. The chemical bath deposition is performed from an aqueous solution (13) in a Pyrex beaker (14) containing the following ingredients: 0.002 M $CdCl_2$, 0.02 M of thiourea, 0.02 M of $NH_4Cl$, and 0.2 M of $NH_4OH$. The solution must be thoroughly mixed until the solution turns yellow in color. The pH value of the aqueous solution is then adjusted to a value preferably in the range 11~12 at room temperature by adding ammonia hydroxide. However, a pH value in the range 9–13 may still be used. The Pyrex beaker with the solution is partly immersed in a hot water bath (15). The deposition may be carried out at solution temperatures in the range from 15° C. to 95° C., but preferably at temperatures above 60° C. and less than 95° C. For illustrative purposes, the temperature of the water bath in this example is maintained at $(80\pm2)°$ C. After this, a clean glass substrate (16) with the patterned gate electrode and dielectric layer is immersed in the aqueous solution. The glass substrate (16) for the CdS deposition is suspended substantially vertically in the solution contained in the beaker. After this, the deposition of CdS film is allowed to proceed for a period of about 5 minutes. After each 5 minutes deposition, the substrate is removed from the bath and ultrasonically cleaned before continuing the subsequent deposition. It is noted that the fresh solution for each dipping should be continuously stirred to obtain homogenous distribution of the chemical components. After 30 minutes of multiple depositions, the CdS film shows a yellow color with a good adherence on the substrate. The thickness of the CdS films deposited for the thin film transistor and circuit applications may be controlled to a value in the range from 100 Å to 2,000 Å by controlling the deposition time. The chemical bath deposited CdS thin films are n-type conduction and the mobility of electrons in as-deposited films is about 0.1 $cm^2$/V-sec, which is comparable to that of an a-Si thin film.

To define active region for the thin film transistor, the semiconductor layer must be selectively etched. The selective etching of the chemical bath deposited CdS films is carried out as follows: (a) apply a layer of photoresist (Shipley AZ 1350) on the CdS film, (b) carry out soft bake at 90° C. for 10 minutes, (c) expose the photoresist to UV light through a mask for 100 seconds and develop, (d) hard bake the photoresist at 110° C. for 10 minutes, (e) etch the exposed CdS regions in 1 M HCl solution for 10~20 seconds, (f) rinse with DI water for at least five minutes, (g) postbake the films for 20 minutes at 110° C. in the oven.

After the selective etching of the semiconductor layer to form the active channel, a layer of passivation material (11) is applied to protect the TFT. The materials of passivation layer may be selected from a group comprising of $SiO_2$, $SiN_x$, $Si_3N_4$, $Al_2O_3$ and polyimide.

Heat Treatment Process for CBD Deposited CdS films

Since the mobility of electrons in as-deposited CdS thin films is low, a heat treatment may be carried out to improve the crystalline quality and thus the electron mobility. This heat treatment may be carried out either before or after the selective etching described in the previous paragraph. The heat treatment of the CdS thin films prepared by the chemical bath deposition method is performed in a hot furnace (17) in the following manner. Referring to FIG. 3, the temperature of the hot furnace is first set at value between 200° C. and 400° C. The as-deposited CdS films (18) are placed in a quartz tube (19) which is introduced into the hot furnace tube (20) directly and the heat treatment is allowed to continue for a period of about a few minutes to a few hours. It is noted that the required heat treatment time is dependent on the temperature.

The heat treatment may be carried out by evacuating the quartz tube (19), by filling the quartz tube with $N_2$, Ar or air. The preferred heat treatment conditions are as follows: (a) place the CdS samples in the quartz tube (19), (b) purge the quartz tube for at least 15 minutes with the desired gas or evacuate the quartz tube to a pressure of $10^{-5}$ torr or less with a vacuum pump, (c) allow $N_2$, Ar to flow through the quartz tube at a rate of about 12 CC/sec. (d) introduce the quartz tube with the CdS sample into the hot furnace tube and allow the heat treatment to continue, (e) withdraw the quartz tube with the sample after few minutes to few hours. For the chemical bath deposited CdS films studied, the mobility of electrons is increased from 0.1 $cm^2$/V-sec to 1.0 $cm^2$/V-sec and the conduction remains to be n-type after a treatment in $N_2$ at 400° C. for 5 minutes.

Fabrication Processes for TFTs with CBD Deposited CdSe films

The CdS semiconductor layer for the thin film transistors or circuits may be replaced by a layer of CdSe, which has greater mobility of electrons than CdS. The chemical bath deposition of CdSe layer for thin film transistors is carried out as follows: (a) Prepare a 0.1 M solution of cadmium chloride. (b) Prepare a 0.1 M solution of sodium selenosulphate by dissolving elemental selenium into $Na_2SeO_3$ solution at 75° C. and with stirring for a few hours. The elemental selenium is preferably in a powder form, with an average powder size of the order of 325 mesh. This results in a nearly clear solution, which when filtered gives a clear solution of sodium selenosulphate. (c) Prepare a 4 M $NH_4OH$ solution. (d) Prepare a deposition bath by mixing 10.0 ml of 0.1 M $Na_2SSeO_3$ reagent, 3.0 ml of 4 M $NH_4OH$, and 10.0 ml of 0.1 M $CdCl_2$. Mix the deposition bath thoroughly until it turns orange in color. The pH value should be adjusted to a value preferably in the range 12~13 at room temperature by adding ammonia hydroxide. However, a pH value in the range 9–13 may still be used.

After the above described deposition bath preparation, the deposition of CdSe should be started. This deposition is similar to that for the deposition of CdS, as shown schematically in FIG. 2, except that the CdS solution (13) is replaced by the solution for CdSe, which is prepared using the process described in the previous paragraph. A clean glass substrate (16) containing patterned electrodes and gate dielectric is suspended vertically in the solution (13) contained in a beaker (14). The beaker is immersed in water bath (15) maintained at a constant temperature $(80+2)°$ C. to allow the CdSe deposition to start. Although the temperature of the water bath is at 80° C. in the above example, the deposition may be carried out at solution temperatures in the range from 15° C. to 95° C., but preferably at temperatures above 60° C. and less than 95° C.

The deposition of CdSe film is allowed to continue for a period of about 5 minutes. The substrate is removed from the bath and ultrasonically cleaned after each deposition and before the subsequent deposition. It is noted that the fresh solution for each dipping should be continuously stirred to obtain homogenous distribution of the chemical components. After 40 minutes of multiple depositions, the CdSe film shows a red/orange color with a good adhesion on the substrate. The thickness of the CdSe films deposited for the thin film transistor and circuit applications may be controlled to a value in the range from 100 Å to 2,000 Å by controlling the deposition time. The chemical bath deposited CdSe films are n-type conduction and the mobility of electrons in as-deposited films is about 2 $cm^2$/V-sec, which is greater than that of an a-Si thin film but smaller than poly-Si. To define active region for the thin film transistor, the semiconductor layer must be selectively etched. The selective etching of the chemical bath deposited CdSe films is carried out as follows: (a) apply a layer of photoresist (Shipley AZ1350) on the CdSe film, (b) carry out soft bake at 90° C. for 10 minutes, (c) expose the photoresist to UV light through a mask for 100 seconds and develop, (d) hard bake the photoresist at 110° C. for 10 minutes, (e) etch the exposed CdS regions in 1 M HCl solution for 20~40 seconds, (f) rinse with DI water for at least five minutes, (g) postbake the films for 20 minutes at 110° C. in the oven.

The fabrication processes for TFTs and circuits involving chemical bath deposited CdSe are similar to that for CdS. Hence the schematic cross-sectional view and top view shown in FIG. 1(a), FIG. 1(b) and FIG. 1(c) may be used to describe the fabrication of TFTs and circuits with CdSe thin films. Referring to FIG. 1(a), where there is shown a TFT (1) embodiment. A glass plate (2) with a thickness of 1 mm is used as the substrate. A layer of metal (3) such as Al or Ta is deposited by standard vacuum deposition method and then patterned to form gate. A layer of dielectric layer (4) is deposited. This dielectric layer may be in a form of $Ta_2O_5$, $TaO_x$ or $Al_2O_3$ which is deposited by an anodization method. Alternately, it may be $SiO_2$, $SiN_x$, $Si_3N_4$, $TiO_2$, $Ta_2O_5$, $TaO_x$ or $Al_2O_3$ and deposited by a CVD method. The thickness of the dielectric layer should be large enough, more than 30 nm, so that leakage current through this dielectric layer is minimized but is not too large, less than 500 mn, to give rise to an excessive threshold voltage of the thin film transistor. Due to the nature of the anodization process, only the surfaces of the metal layer (3) are covered by the dielectric layer. After the deposition of the thin dielectric layer, windows (5,6) as shown in FIG. 1(c) are cut through the dielectric layer by photolithography and etching method for electrical contacts. A layer of semiconductor CdSe (7) is now deposited over the entire sample surface by a chemical bath deposition method and then selectively etched by a photolithography and etching method to create active channel region (8) of the thin film transistor. Metal contacts for drain (9) and source (10) are deposited by a vacuum deposition and selective etching method. As a final step, a layer of $SiN_x$ or polyimide (11) may be applied over the entire surface as protective layer. When the dielectric layer is deposited by the CVD method, as shown in FIG. 1(b), the dielectric layer (12) covers the entire substrate. A top view of the TFT in FIG. 1(a) is shown in FIG. 1(c). It is understood that these figures are presented for description purposes only. Dimensions and relative position of each region may vary with the design. In addition, a large number of TFTs may be incorporated into a single substrate for circuit applications. These TFTs will be fabricated in the same fabrication run using the chemical bath deposition method for the active layer.

After the selective etching of the semiconductor layer to form the active channel, a layer of passivation material (11) is applied to protect the TFT. The materials of passivation layer may be selected from a group comprising of $SiO_2$, $SiN^x$, $Si_3N_4$, $Al_2O_3$ and polyimide.

Heat Treatment Process for CBD Deposited CdSe films

Although the mobility of electrons in as-deposited CdSe thin films is greater than that in a-Si, a heat treatment may be carried out to improve further the crystalline quality and thus the electron mobility. This heat treatment may be carried out either before or after the selective etching described in the previous paragraph. The heat treatment of the CdSe thin films prepared by the chemical bath deposition method is performed in a manner similar to that for CdS. Hence the schematic diagram of the set-up shown in FIG. 3 may be used to described the heat treatment process. The temperature of a hot furnace (17) is first set at value between 200° C. and 400° C. The as-deposited CdSe films (18) are placed in a quartz tube (19) which is introduced into the hot furnace tube (20) directly and the heat treatment is allowed to continued for a period of about a few minutes to a few hours.

The heat treatment may be carried out by evacuating the quartz tube, by filling the quartz tube with $N_2$, Ar or air. The preferred heat treatment conditions are as follows: (a) place the CdSe sample in the quartz tube (19), (b) purge the quartz tube for at least 15 minutes with the desired gas or evacuate the quartz tube to $10^{-5}$ torr or below with a vacuum system, (c) allow $N_2$, Ar to flow through the quartz tube at a rate of about 12 CC/sec. (d) introduce the quartz tube with the CdSe sample into the hot furnace tube and allow the heat treatment to proceed (e) withdraw the quartz tube with the sample after few minutes. After a treatment in $N_2$ at 400° C. for 3–5 minutes, the conduction remains n-type and the mobility of electrons in chemical bath deposited CdSe thin films is increased from 2 $cm^2$/V-sec to 15 $cm^2$/V-sec. The improvements of electron mobility may also be achieved by carrying out heat treatment experiments in a heating chamber containing gases other than $N_2$.

Etching of CBD Deposited CdSe Films

To form the active regions for the thin film transistors, the CdSe films must be selectively etched. The selective etching of the chemical bath deposited CdSe films is carried out as follows: (a) apply a layer of photoresist, such as AZ1350 on the CdSe film, (b) carry out soft bake at 90° C. for 10 minutes, (c) expose the photoresist to UV light through a mask for 100 seconds and develop, (d) hard bake the photoresist for 10 minutes at 110° C. in the oven. (f) etch the exposed CdSe regions in 1 M HCl solution for 20–40 seconds, (g) rinse with DI water for at least five minutes, (h) postbake the films for 20 minutes at 110° C. in the oven.

Thin Film Transistor Results

Using the processes described in the embodiments of the present invention, good quality thin film transistors have been fabricated and tested. Results for a typical TFT with chemical bath deposited CdS active layer are shown in FIG. 4, where the drain current is plotted versus the drain voltage for four gate voltages. The saturation behavior of the transistor is evident in the output characteristics. A threshold voltage of $V_t=3$ V and a mobility value of $\mu_{eff}=1$ cm$^2$/V-sec have been deduced for this transistor. The ON-current of the CdS-TFT at 10 V gate bias and 10 V source-drain voltage is 4 $\mu$A and the OFF-current at zero-gate-bias at 10 V source-drain voltage is 3 pA, respectively. It is therefore clear that this CdS TFT is suited to switching applications. The results demonstrate that CdS TFTs fabricated by the chemical bath deposition are quite adequate for the application of active matrix thin-film-transistors addressed electronic display.

Results for a typical TFT with chemical bath deposited CdSe active layer are shown in FIG. 5. The saturation behavior of the transistors is evident in the output characteristics. A threshold voltage of $V_t=1$ V and a mobility value of $\mu_{eff}=15$ cm$^2$/V-sec have been deduced. The ON-current of the CdSe-TFT at 10 V gate bias and 10 V source-drain voltage is 73 $\mu$A and the OFF-current at zero-gate-bias at 10 V source-drain voltage is 18 pA, respectively. It is therefore clear that this TFT is suited to switching applications. The results demonstrate that CdSe TFT fabricated by chemical bath deposition is quite adequate for the application of active matrix thin-film-transistors addressed electronic display. This will be the technology that supplies the designer with the sufficient device performance but at the minimum cost in terms of complicating the process. Also, this technology can be reproduced and fabricated in a uniform manner over a large area and as a possible alternative way to poly-Si technology.

While the invention has been described in conjunction with illustrated embodiments, it will be understood that it is not intended to limit the invention to such embodiments. On the contrary, it is intended to cover all alternatives, modifications and equivalents as may be included within the spirit and scope of the invention as defined by the appended claims. For instance, the substrates for the fabrication of thin film transistors and circuits may be insulators other than the glass substrates cited in the embodiments. The materials for thin film transistors may be different from CdS and CdSe. This can include CdTe, ZnS, and ZnSe. In addition, the low temperature chemical deposition method for the forming of semiconductor active layers of TFTs and circuit may allow the fabrication to be carried out on flexible plastic substrates.

The embodiments of the invention in which an exclusive property or privilege is claimed are defined as follows:

1. A low cost method for fabricating a plurality of thin film field effect transistors and circuits with high mobility on a substrate, the method comprising the steps of;

depositing and patterning a first metal layer to form at least one gate electrode;

forming a thin dielectric layer on each of said gate electrodes;

preparing a chemical deposition bath and controlling temperature of said chemical deposition bath;

depositing a first semiconductor layer by a chemical bath deposition method in said chemical deposition bath;

patterning and etching said first semiconductor layer to form at least one active channel;

depositing and patterning a second metal layer to form a drain and a source for each of said thin film transistors; and heat treating at an elevated temperature either in vacuum or in an inert atmosphere.

2. A low cost method for fabricating thin film field effect transistors and circuits with high mobility on a substrate in claim 1, wherein electronic quality of said first semiconductor layer is controlled by adjusting the chemical composition and temperature of said chemical deposition bath.

3. A low cost method for fabricating thin film field effect transistors and circuits with high mobility on a substrate in claim 1, wherein electronic quality of said first semiconductor layer is controlled by adjusting the temperature of said chemical deposition bath to a value in the rage from 15° C. to 95° C.

4. A low cost method for fabricating thin film field effect transistors and circuits with high mobility on a substrate in claim 1, wherein electronic quality of said first semiconductor layer is further controlled by adjusting the pH value of said chemical deposition bath to a range from 10 to 13.

5. A low cost method for fabricating thin film field effect transistors and circuits with high mobility on a substrate in claim 1, wherein material of said first semiconductor layer is selected from a group comprising of CdS, CdSe, ZnS, ZnSe and CdTe.

6. A low cost method for fabricating thin film field effect transistors and circuits with high mobility on a substrate in claim 1, wherein said thin dielectric layer on said gate electrode is selected from a group comprising of $Ta_2O_5$, $TaO_x$ and $Al_2O_3$, and formed by an anodization method.

7. A low cost method for fabricating thin film field effect transistors and circuits with high mobility on a substrate in claim 1, wherein said thin dielectric layer on said gate electrode is selected from a group comprising of $SiO_2$, $SiN_x$, $Si_3N_4$, $TiO_2$, $Ta_2O_5$, $TaO_x$ and $Al_2O_3$, and formed by a chemical vapour deposition method.

8. A low cost method for fabricating thin film field effect transistors and circuits with high mobility on a substrate in claim 1, further comprising a step of passivating surfaces of said thin film transistors and circuits by applying a passivation layer, materials of said passivation layer being selected from a group comprising of $SiO_2$, $SiN_x$, $Si_3N_4$, $Al_2O_3$ and polyimide.

* * * * *